(12) United States Patent  
Atwater, Jr. et al.

(10) Patent No.: US 7,846,759 B2  
(45) Date of Patent: Dec. 7, 2010

(54) MULTI-JUNCTION SOLAR CELLS AND METHODS OF MAKING SAME USING LAYER TRANSFER AND BONDING TECHNIQUES

(75) Inventors: Harry A. Atwater, Jr., Pasadena, CA (US); James Zahler, Pasadena, CA (US); Anna Fontcuberta i Morral, Paris (FR); Sean Olson, Santa Monica, CA (US)

(73) Assignee: Aonex Technologies, Inc., Salem, NH (US)

( * ) Notice: Subject to any disclaimer, the term of this patent is extended or adjusted under 35 U.S.C. 154(b) by 1355 days.

(21) Appl. No.: 11/255,194

(22) Filed: Oct. 21, 2005

(65) Prior Publication Data  
US 2006/0112986 A1 Jun. 1, 2006

Related U.S. Application Data

(60) Provisional application No. 60/620,425, filed on Oct. 21, 2004.

(51) Int. Cl.  
*H01L 31/00* (2006.01)

(52) U.S. Cl. .................. 438/57; 438/458; 257/E31.001; 257/431

(58) Field of Classification Search .................. 438/57, 438/455, 458; 257/414, 431, 461, E31.001  
See application file for complete search history.

(56) References Cited

U.S. PATENT DOCUMENTS

| | | | |
|---|---|---|---|
| 4,474,647 A | 10/1984 | Asselineau et al. |
| 4,499,327 A | 2/1985 | Kaiser |
| 5,013,681 A | 5/1991 | Godbey et al. |
| 5,090,977 A | 2/1992 | Strack et al. |
| 5,217,564 A | 6/1993 | Bozler et al. |
| 5,231,047 A | 7/1993 | Ovshinsky et al. |
| 5,336,841 A | 8/1994 | Adams |
| 5,374,564 A | 12/1994 | Bruel |
| 5,391,257 A | 2/1995 | Sullivan et al. |
| 5,609,734 A | 3/1997 | Streicher et al. |
| 5,637,187 A | 6/1997 | Takasu et al. |
| 5,641,381 A | 6/1997 | Bailey et al. |
| 5,710,057 A | 1/1998 | Kenney |

(Continued)

FOREIGN PATENT DOCUMENTS

EP 0 060 103 9/1982

(Continued)

OTHER PUBLICATIONS

Curtis Eng et al., "Integration of the UOP/HYDRO MTO Process into Ethylene Plants," 10th Ethylene Producers' Conference, 1998, pp. 54-85.

(Continued)

*Primary Examiner*—Matthew S Smith  
*Assistant Examiner*—Michele Fan  
(74) *Attorney, Agent, or Firm*—Finch & Moloney PLLC

(57) ABSTRACT

A multi-junction solar cell includes an active silicon subcell, a first non-silicon subcell bonded to a first side of the active silicon subcell, and a second non-silicon subcell bonded to a second side of the active silicon subcell. This and other solar cells may be formed by bonding and layer transfer.

5 Claims, 13 Drawing Sheets

U.S. PATENT DOCUMENTS

| | | | |
|---|---|---|---|
| 5,720,929 | A | 2/1998 | Minkkinen et al. |
| 5,877,070 | A | 3/1999 | Goesele et al. |
| 5,882,987 | A | 3/1999 | Srikrishnan |
| 5,914,433 | A | 6/1999 | Marker |
| 6,020,252 | A | 2/2000 | Aspar et al. |
| 6,103,597 | A | 8/2000 | Aspar et al. |
| 6,121,504 | A | 9/2000 | Kuechler et al. |
| 6,150,239 | A | 11/2000 | Goesele et al. |
| 6,190,937 | B1 * | 2/2001 | Nakagawa et al. ............ 438/67 |
| 6,221,738 | B1 | 4/2001 | Sakaguchi et al. |
| 6,242,324 | B1 | 6/2001 | Kub et al. |
| 6,323,108 | B1 | 11/2001 | Kub et al. |
| 6,328,796 | B1 | 12/2001 | Kub et al. |
| 6,340,788 | B1 * | 1/2002 | King et al. ................ 136/261 |
| 6,346,458 | B1 | 2/2002 | Bower |
| 6,426,235 | B1 * | 7/2002 | Matsushita et al. ............ 438/22 |
| 6,429,104 | B1 | 8/2002 | Auberton-Herve |
| 6,465,327 | B1 | 10/2002 | Aspar et al. |
| 6,497,763 | B2 | 12/2002 | Kub et al. |
| 6,504,091 | B2 | 1/2003 | Hisamatsu et al. |
| 6,794,276 | B2 | 9/2004 | Letertre et al. |
| 6,815,309 | B2 | 11/2004 | Letertre et al. |
| 6,867,067 | B2 | 3/2005 | Ghyselen et al. |
| 6,908,828 | B2 | 6/2005 | Letertre et al. |
| 7,019,339 | B2 | 3/2006 | Atwater et al. |
| 2002/0190269 | A1 * | 12/2002 | Atwater et al. ............ 257/184 |
| 2003/0064535 | A1 | 4/2003 | Kub et al. |
| 2004/0214434 | A1 | 10/2004 | Atwater et al. |
| 2004/0235268 | A1 | 11/2004 | Letertre et al. |
| 2005/0026432 | A1 | 2/2005 | Atwater et al. |
| 2005/0032330 | A1 | 2/2005 | Ghyselen et al. |
| 2005/0085049 | A1 | 4/2005 | Atwater et al. |
| 2005/0142879 | A1 | 6/2005 | Atwater et al. |
| 2005/0161078 | A1 * | 7/2005 | Aiken ...................... 136/259 |
| 2005/0275067 | A1 | 12/2005 | Atwater et al. |

FOREIGN PATENT DOCUMENTS

| | | |
|---|---|---|
| JP | 03-270220 | 2/1991 |
| WO | WO 01/03172 A1 | 1/2001 |

OTHER PUBLICATIONS

Bett et al., III-V Compounds for Solar Cell Applications, Appl. Phys. A, 1999, pp. 119-129, vol. 69, Springer-Verlag (published online: Jun. 24, 1999).

Bruel et al., Smart-Cut: A New Silicon on Insulator Material Technology Based on Hydrogen Implantation and Wafer Bonding, Mar. 1997, pp. 1636-1641, vol. 36, Jpn. J. Appl. Phys.

Cheng et al., Electron Mobility Enhancement in Strained-Si n-MOSFETs Fabricated on SiGe-on-Insulator (SGOI) Substrates, IEEE Electron Device Letters, Jul. 2001, pp. 321-323, vol. 22, No. 7.

Dobaczewski et al., Donor Level of Bond-Center Hydrogen in Germanium, Physical Review B, 2004, pp. 245207-1-6, vol. 69.

Georgakilas et al., Wafer-scale Integration of GaAs Optoelectronic Devices with Standard Si Integrated Circuits Using a Low-Temperature Bonding Procedure, Applied Physics Letters, Dec. 2002, pp. 5099-5101, vol. 81, No. 27, American Institute of Physics [Downloaded Oct. 19, 2004].

Gösele et al., Fundamental Issues in Wafer Bonding, J. Vac. Sci. Technol. A, Jul./Aug. 1999, pp. 1145-1152, vol. 17(4), American Vacuum Society.

Gösele et al., Semiconductor Wafer Bonding. Annu. Rev. Mater. Sci., 1998, pp. 215-241, vol. 28.

U.S. Appl. No. 11/004,808, filed Dec. 7, 2004, Atwater et al.

U.S. Appl. No. 11/193,637, filed Aug. 1, 2005, Atwater et al.

U.S. Appl. No. 11/357,436, filed Feb. 21, 2006, Atwater et al.

Huang et al., SiGe-on-Insulator Prepared by Wafer Bonding and Layer Transfer for High-Performance Field-Effect Transistors, Applied Physics Letters, Feb. 2001, pp. 1267-1269, vol. 78, No. 9, American Institute of Physics.

Tong et al., "Layer Splitting Process in Hydrogen-Implanted Si, Ge, SiC, and Diamond Substrates," Appl. Phys. Lett., vol. 70, No. 11, Mar. 17, 1997, pp. 1390-1392.

Huang et al., Electron and Hole Mobility Enhancement in Strained SOI by Wafer Bonding, IEEE Transactions on Electron Devices, Sep. 2002, pp. 1566-1571, vol. 49, No. 9.

Langdo et al., Strained Si on Insulator Technology: From Materials to Devices, Solid-State Electronics, 2004, pp. 1357-1367, vol. 48, Elsevier Ltd.

Leroy et al., Controlled Surface Nanopatterning with Buried Dislocation Arrays, Surface Science, 2003, pp. 211-219, vol. 545, Elsevier B.V.

Ma et al., Solid-State Reaction-Mediated Low-Temperature Bonding of GaAs and InP Wafers to Si Substrates, Appl. Phys. Lett., Feb. 1994, pp. 772-774, vol. 64, No. 6, American Institute of Physics.

Maleville et al., Smart-Cut® Technology: From 300 mm Ultrathin SOI Production to Advanced Engineered Substrates, Solid-State Electronics, 2004, pp. 1055-1063, vol. 48, Elsevier Ltd.

Morral et al., InGaAs/InP Double Heterostructures on InP/Si Templates Fabricated by Wafer Bonding and Hydrogen-Induced Exfoliation, Applied Physics Letters, Dec. 2003, pp. 5413-5415, vol. 83, No. 26, American Institute of Physics.

Tong et al., Wafer Bonding and Layer Splitting for Microsystems, Adv. Mater., 1999, pp. 1409-1425, vol. 11, No. 17, Wiley-VCH Verlag GmbH.

Tong et al., Layer Splitting Process in Hydrogen-Implanted Si, Ge, SiC, and Diamond Substrates, Appl. Phys. Letter, Mar. 1997, pp. 1390-1392, vol. 70, No. 11, American Institute of Physics.

Tong et al., Hydrophobic Silicon Wafer Bonding, Appl. Phys. Lett., Jan. 1994, pp. 625-627, vol. 64, No. 5, American Institute of Physics.

Tong et al., A "Smarter-Cut" Approach to Low Temperature Silicon Layer Transfer, Appl. Phys. Lett., Jan. 1998, pp. 49-51, vol. 72, No. 1, American Institute of Physics.

Zahler et al., Ge Layer Transfer to Si for Photovoltaic Applications, Thin Solid Films, 2002, pp. 558-562, vol. 403-404, Elsevier Science B.V.

Zahler et al., Wafer Bonding and Layer Transfer Processes for 4-Junction High Efficiency Solar Cells, 29th IEEE Photovoltaic Specialists Conference, New Orleans, USA, (May 2002).

Auberton-Hervé et al., Smart-Cut® The Basic Fabrication Process for UNIBOND® SOI Wafers, IEICE Trans. Electron, Mar. 1997, pp. 358-363, vol. E80-C, No. 3, The Institute of Electronics, Information and Communication Engineers.

Tracy et al., Germanium-on-Insulator Substrates by Wafer Bonding, Journal of Electronic Materials, 2004, pp. 886-892, vol. 33, No. 8.

Zahler et al., J. Electron Mater., 33(8), (2004), pp. 22-23, (Abstracts K2 and K3).

Akatsu et al., Wafer Bonding of Different III-V Compound Semiconductors by Atomic Hydrogen Surface Cleaning, Journal of Applied Physics, Oct. 2001, pp. 3856-3862, vol. 90, No. 8, American Institute of Physics.

Bruel M., Silicon on Insulator Material Technology, Electronics Letters, Jul. 1995, pp. 1201-1202, vol. 31, No. 14.

Bruel M., Application of Hydrogen Ion Beams to Silicon on Insulator Material Technology, Nuclear Instruments and Methods in Physics Research B, 1996, pp. 313-319, vol. 108, Elsevier Science B.V.

Kim et al., Heterogeneous Silicon Integration by Ultra-High Vacuum Wafer Bonding, Journal of Electronic Materials, 2003, pp. 849-854, vol. 32, No. 8.

Lagnado et al., Integration of Si and SiGe with $Al_2O_3$ (sapphire), Microelectronic Engineering, 2001, pp. 455-459, vol. 59, Elsevier Science B.V.

Taraschi et al., Strained Si, SiGe, and Ge On-Insulator: Review of Wafer Bonding Fabrication Techniques, Solid-State Electronics, 2004, pp. 1297-1305, vol. 48, Elsevier Ltd.

Wiegand et al., Wafer Bonding of Silicon Wafers Covered with Various Surface Layers, Sensors and Actuators, 2000, pp. 91-95, vol. 86, Elsevier Science B.V.

Yamaguchi M., Multi-Junction Solar Cells and Novel Structures for Solar Cell Applications, Physica E, 2002, pp. 84-90, vol. 14, Elsevier Science B.V.

Zahler et al., Wafer Bonded Ge/Si Heterostructures for Photovoltaic Applications, Presentation, MRS 2002 Fall Meeting, 16 pages, (Nov. 2002).

Zahler et al., Wafer Bonded Ge/Si Heterostructures for Photovoltaic Applications, (Presentation), Electronic Materials Conference 2002, 16 pages.

Zahler et al., Wafer Bonded Ge/Si Heterostructures for Photovoltaic Applications, (Abstract and Presentation), MRS 2002 Spring Meeting (Apr. 2002).

Zahler J.M., Materials Integration by Wafer Bonding and Layer Transfer, (Presentation), 13 pages, MRS 2004 Spring Meeting (Apr. 2004).

Zahler et al., The Role of H in the H-Induced Exfoliation of GE Films, (Abstract and Presentation), MRS 2004 Spring Meeting, 16 pages (Apr. 2004).

Zahler et al., Wafer Bonded Expitaxial Templates for GaAs/Si Heterostructures, (Abstract and Presentation), MRS 2003 Spring Meeting, 16 pages, (Apr. 2003).

Zahler et al., Wafer Bonded Expitaxial Templates for GaAs/Si and InP/Si Heterostructures, (Presentation), MRS 2003 Fall Meeting, 15 pages, (Nov. 2003).

Zahler et al., Wafer Bonding Processes for Ultrahigh Efficiency Photovoltaic Applications, (Presentation), MRS 2001 Fall Meeting, (Nov. 2001).

Zahler et al., GE Layer Transfer to Si for Photovoltaic Applications, (Presentation), 14 pages, MRS 2001 Spring Conference, (Jun. 31, 2001).

Zahler et al., Wafer Bonding and Layer Transfer Processes for A 4-Junction Solar Cell, (Presentation) 29$^{th}$ IEEE Photovoltaic Specialists Conference, New Orleans, USA, (May 2002), 1 pg.

Zahler et al., Ge/Si Wafer Bonded Epitaxial Templates for GaAs/Si Heterostructures, (Abstract), MRS 2002 Fall Meeting, (Nov. 2002).

Morral et al., Bonding and Layer Transfer Process of InP on Silicon for the Elaboration of the Botton Double Heterostructure of 4-Junction High Efficiency Solar Cells, (Abstract), MRS 2002 Fall Meeting, (Nov. 2002).

Morral et al., Assessment of Optical and Structural Properties of III-V Semiconductors Grown on InP/Si and Ge/Si Wafer Bonded Epitaxial Templates with Application to a Four-Junction Solar Cell, (Abstract), MRS 2003 Spring Meeting, (Apr. 2003).

Morral et al., Electrical and Structural Characterization of the Interface of Wafer Bonded InP/Si, MRS 2003 Spring Meeting, (Apr. 2003).

Morral et al., The Role of Hydrogen in H-Induced Exfoliation and Layer Transfer on InP, (Abstract), MRS 2004 Spring Meeting, (Apr. 2004).

Weldon et al., "Mechanism of Silicon Exfoliation Induced by Hydrogen/Helium Co-Implantation," Applied Physics Letters, vol. 73, No. 25, Dec. 21, 1998, pp. 3721-3723.

Nell et al, IEEE Trans. Electron. Dev., vol. 34, p. 257, 1987.

* cited by examiner

21

71

81

MULTI-JUNCTION SOLAR CELLS AND METHODS OF MAKING SAME USING LAYER TRANSFER AND BONDING TECHNIQUES

CROSS-REFERENCE TO RELATED PATENT APPLICATIONS

The present application claims benefit of priority of U.S. provisional application Ser. No. 60/620,425, filed on Oct. 21, 2004, which is incorporated herein by reference it its entirety.

BACKGROUND OF THE INVENTION

The invention is directed to solar cells, such as multi-junction solar cells made by wafer bonding and layer transfer.

There is considerable interest in the design and fabrication of tandem multi-junction solar cells for high efficiency photovoltaics for space-based and terrestrial applications. Multi-junction solar cells consist of two or more p-n junction sub-cells with band gaps engineered to enable efficient collection of the broad solar spectrum. The subcell band gaps are controlled such that as the incident solar spectrum passes down through the multi-junction solar cell it passes through subcells of sequentially decreasing band gap energy. Thus, the efficiency losses associated with single-junction cells, i.e., the inefficient collection of high-energy photons and failure to collect low-energy photons, are minimized. Multi-junction solar cells are generally fabricated using a monolithic process that leads to series connected subcells. Electrical connection between subcells is performed by a heavily doped tunnel junction formed during the growth of the multi-junction structure. In the devices described below, it is understood that the subcells are electrically connected with such a structure. In series-wired multi-junction solar cells, it is important for the photo-current generated by solar radiation in each subcell to be closely matched to all other subcells in the multi-junction solar cell structure. This design constraint along with materials integration limitations due to crystal lattice-matching requirements that accompany the use of epitaxy to fabricate multi-junction solar cells limit the number of subcells that can presently be integrated.

SUMMARY OF THE INVENTION

One embodiment of the invention relates to a multi-junction solar cell comprising an active silicon subcell, a first non-silicon subcell bonded to a first side of the active silicon subcell, and a second non-silicon subcell bonded to a second side of the active silicon subcell.

Another embodiment of the invention relates to a method of making a multi-junction solar cell module, comprising forming at least one subcell of a multi-junction solar cell on a handle structure, bonding the at least one subcell to a solar radiation transparent protective structure, and removing the handle structure to leave at least one subcell bonded to the protective structure.

DETAILED DESCRIPTION OF THE PREFERRED EMBODIMENTS

Figure 1:
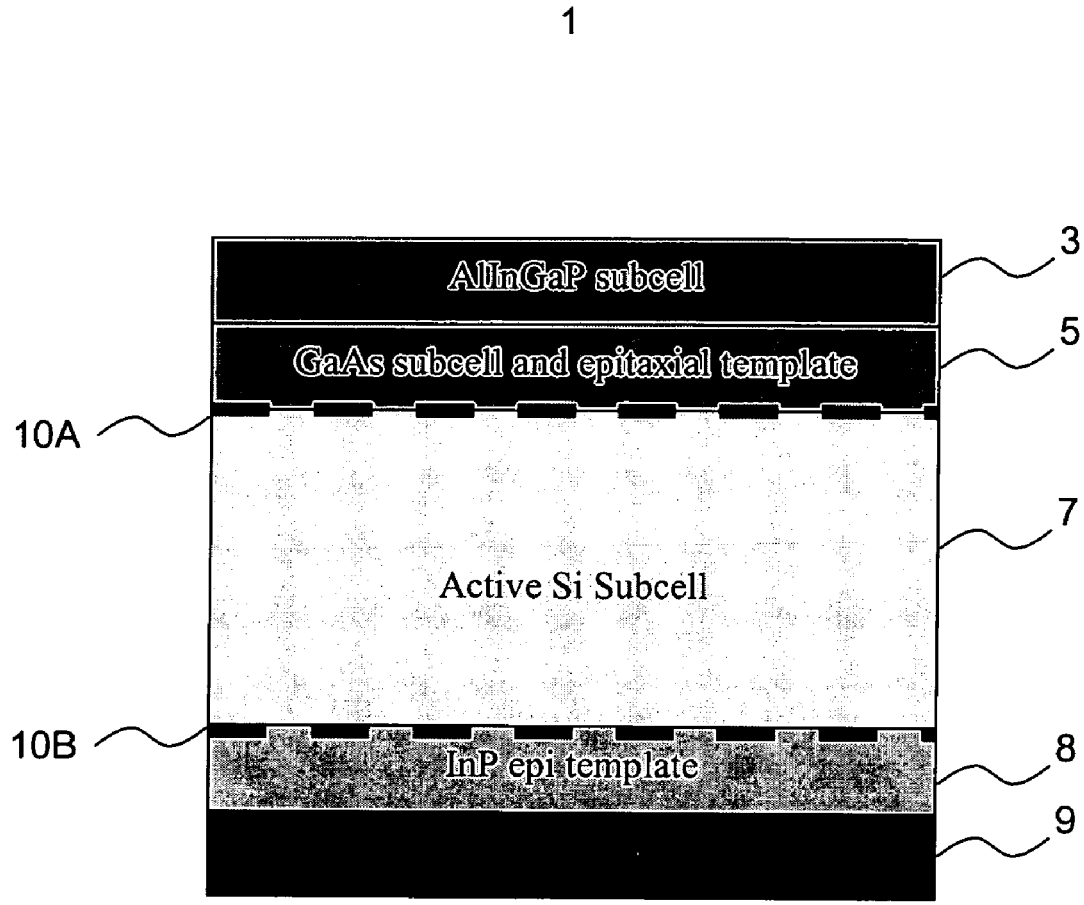
FIGS. 1-13 show schematic side cross sectional views of solar cells according to the embodiments of the invention.

Wafer bonding and layer transfer enables the integration of otherwise incompatible materials to form novel multi-junction solar cell structures. As described above, wafer bonding enables the fabrication of novel multi-junction solar cells by expanding the opportunity to integrate III-V semiconductors into a single monolithic structure. The materials of interest for the subcells of new multi-junction solar cell designs are III-V semiconductor thin films that can be grown with high quantum efficiency. These materials include, but are not limited to, InGaAs, GaAs, AlGaAs, InGaP, InP, InGaAsP. More broadly, these subcells can be comprised of any binary, ternary, or quaternary combination of B, Al, Ga, In, N, P, As, and Sb. In addition to the III-V semiconductors, group IV semiconductors can be used as active subcells in a wafer-bonded multi-junction solar cell. In particular, Si and Ge are candidate materials. Binary group IV alloys comprised of C, Si, Ge, and Sn are also candidates for subcell material.

In addition to integration of III-V and group IV subcells into monolithic multi-junction solar cell structures, wafer bonding enables the fabrication of these devices on low-cost substrates such as Si. Other potential substrate materials include glass, sapphire and group IV and III-V semiconductors. In multi-junction solar cells fabricated on Si substrates, the Si substrate can serve as either a mechanical support substrate through which power is extracted or as active high quantum efficiency subcell of the multi-junction tandem solar cell that it supports.

When silicon is integrated with thin films of non-lattice-matched III-V semiconductors to form epitaxial templates for the growth of III-V photovoltaic structures, the resulting tandem cell offers the desirable properties of Si, such as high thermal conduction, low density, superior mechanical toughness, low cost, along with the optoelectronic properties of the compound semiconductor films mentioned above, such as high carrier mobilities, high coefficients of absorption, and a compositionally-tunable band-gap energy.

Wafer bonding presents a solution to the problem of integrating these non-lattice-matched materials without the use of epitaxy, which can substantially limit cell performance. Multi-junction solar cells, such as two, three, or four junction cells may be fabricated by wafer bonding and subsequent layer transfer. It should be noted that the structures illustrated in the Figures are intended to represent examples of the more general concepts described and claimed herein and are not intended to limit the scope of the claims. Furthermore, any feature of the devices and methods described in any of the embodiments of the invention described below may be used together with any other feature of the devices and methods of any other embodiment of the invention.

First Embodiment: Multi-Junction Cells Based on Active Si Sub-cells

In the first embodiment of the invention, a multi-junction solar cell comprises an active silicon subcell, a first non-silicon subcell bonded to a first side of the active silicon subcell and a second non-silicon subcell bonded to a second side of the active silicon subcell. The first subcell comprises a p-n junction in a first non-silicon semiconductor material and the second subcell comprises a p-n junction in a second non-silicon semiconductor material different from the first semiconductor material. Preferably, the active silicon subcell comprises a silicon wafer containing a p-n junction. This forms a triple-junction solar cell in which the silicon subcell comprises a middle subcell with the other two non-silicon subcells being bonded to opposite sides of the silicon subcell.

If a four junction solar cell is desirable, then the solar cell further comprises a third non-silicon subcell comprising a p-n junction in a third non-silicon semiconductor material different from the first and second semiconductor materials. The third non-silicon subcell electrically contacts the second non-silicon subcell. Preferably, a first side of the second non-silicon subcell is bonded to the second side of the active silicon subcell and the third non-silicon subcell is epitaxially grown on a second side of the second non-silicon subcell. Preferably, the third semiconductor material comprises a first band gap, the second semiconductor material comprises a second band gap that is narrower than the first band gap but wider than a band gap of silicon, and the third semiconductor material comprises a band gap which is narrower than the band gap of silicon. Preferably, the first semiconductor material comprises InGaAs or Ge, the second semiconductor material comprises GaAs and the third semiconductor material comprises "AlInGaP", which includes AlGaP, InGaP, AlInGaP. This material may be written as $Al_xIn_yGa_{1-x-y}P$ where x and y range from zero to less than one, such as 0 to 0.6, and one but not both of x or y may equal to zero.

A first example of a four junction solar cell 1 that includes an active silicon sub-cell is shown in FIG. 1. The cell 1 structure is comprised of an $Al_xIn_yGa_{1-x-y}P$ p-n junction subcell 3 on top of a GaAs p-n junction subcell 5 with a tunnel junction connecting the two subcells 3, 5. The GaAs thin-film that forms the basis for the GaAs subcell 5 is epitaxially grown on a thin GaAs layer (also referred to as an epitaxial template) that is formed using wafer bonding and layer transfer on the silicon substrate or wafer which forms the basis for the active silicon subcell 7. Specifically, the GaAs epitaxial template may be formed by implanting ions into a GaAs wafer to create a damaged or weak region, bonding the GaAs wafer to the silicon wafer and annealing the bonded structure to exfoliate the GaAs epitaxial template layer from the GaAs substrate. This leaves a thin GaAs epitaxial template layer bonded on the silicon wafer, upon which the GaAs subcell 5 is epitaxially grown. Subsequently, the $Al_xIn_yGa_{1-x-y}P$ subcell 5 is epitaxially grown on the GaAs subcell 3.

The silicon substrate or wafer which comprises at least a portion of the silicon subcell 7 provides mechanical support to the device and is appropriately doped by implantation or diffusion to create an active p-n junction subcell 7 before the bonding steps. Alternatively, the silicon subcell 7 p-n junction is formed by epitaxially growing a silicon layer of a first conductivity type on a silicon wafer of an opposite conductivity type. In this case, the GaAs template or the InP template are bonded to the silicon layer rather than to the silicon wafer. In general, the silicon wafer and/or an epitaxial silicon layer covered silicon wafer are referred to herein as a silicon substrate.

Either prior to or following the fabrication of the AlInGaP 3 and GaAs 5 subcells on the wafer bonded and transferred GaAs epitaxial template, a thin InP epitaxial template layer 8 is wafer bonded and layer transferred to the backside of the silicon substrate of the silicon subcell 7. The InP layer 8 it serves as an epitaxial template for the growth of an InGaAs p-n junction subcell 9. Thus, a four junction solar cell 1 containing a middle silicon subcell 7 contains bonded interfaces 10A, 10B on both major sides of the subcell 7.

The device 1 described above is series connected with two terminals. However, by changing the nature of the bonded interfaces 10A, 10B to make them electrically insulating, the AlInGaP and GaAs, Si, and InGaAs subcell regions that are separated by bonded interfaces could be wired in a parallel geometry to ease the constraints on subcell current matching in the finished structure.

Figure 2:
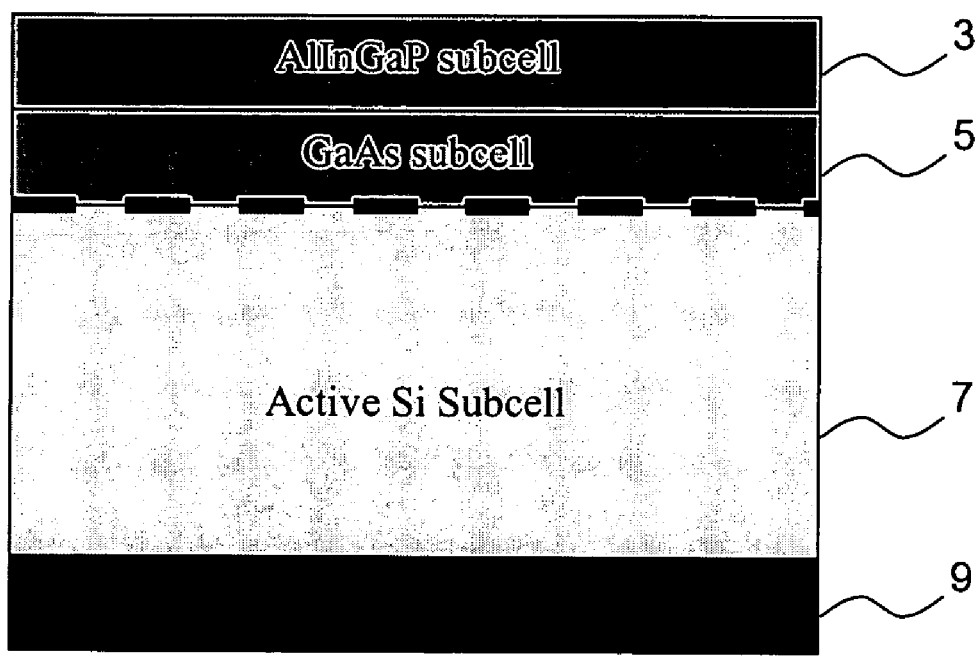

A second example of a four junction cell 11 that includes an active silicon subcell 7 is shown in FIG. 2. In this cell 11, an AlInGaP and GaAs p-n junction subcells are grown on a GaAs template on an intermediate handle substrate and then the completed subcells 3, 5 are bonded to a silicon substrate (i.e., silicon wafer or layer of subcell 7) via any of a number of methods, some of which are described below. In this case, the GaAs epitaxial template layer is not bonded to the silicon substrate of subcell 7 before subcell 5 and 3 epitaxial growth.

Similarly, as shown in FIG. 2, the InGaAs subcell 9 is grown on an InP thin film on an intermediate handle substrate and then the completed subcell 9 is bonded to the silicon substrate. In this case, the InP template layer 8 is not first bonded to the silicon substrate of the subcell 7 before epitaxial growth of subcell 9.

Figure 3:
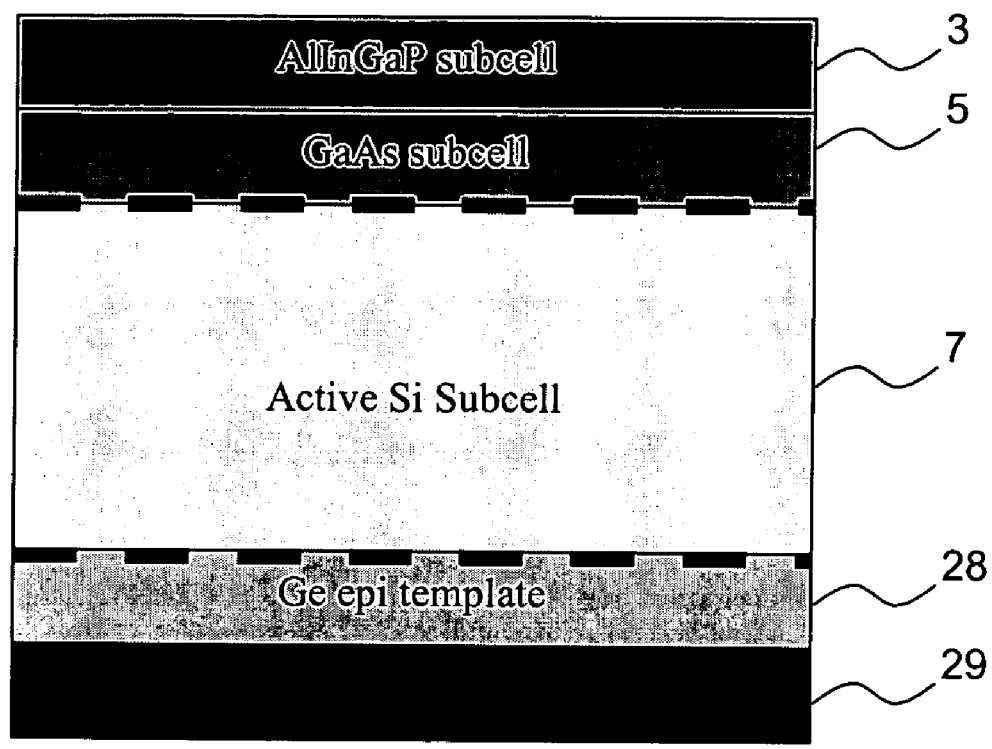

FIG. 3 illustrates a third example of a four junction cell 21 with an active silicon subcell. In this case, the top AlInGaP and GaAs p-n junction subcells 3, 5 are identical to those in cells 1, 11 of FIGS. 1 and 2. However, in cell 21, the InP subcell 9 is replaced with a Ge subcell 29. In cell 21, a Ge epitaxial template layer 28 is wafer bonded and layer transferred to the backside of the silicon substrate of the silicon subcell 7. Layer 28 serves as an epitaxial template for the growth of a Ge p-n junction subcell 29. As with the method of making the cell 1 of FIG. 1, the Ge bonding and subcell 29 fabrication can be performed prior to or following the bonding and growth steps required for the integration of the AlInGaP 3 and GaAs 5 subcells with the Si substrate.

Figure 4:
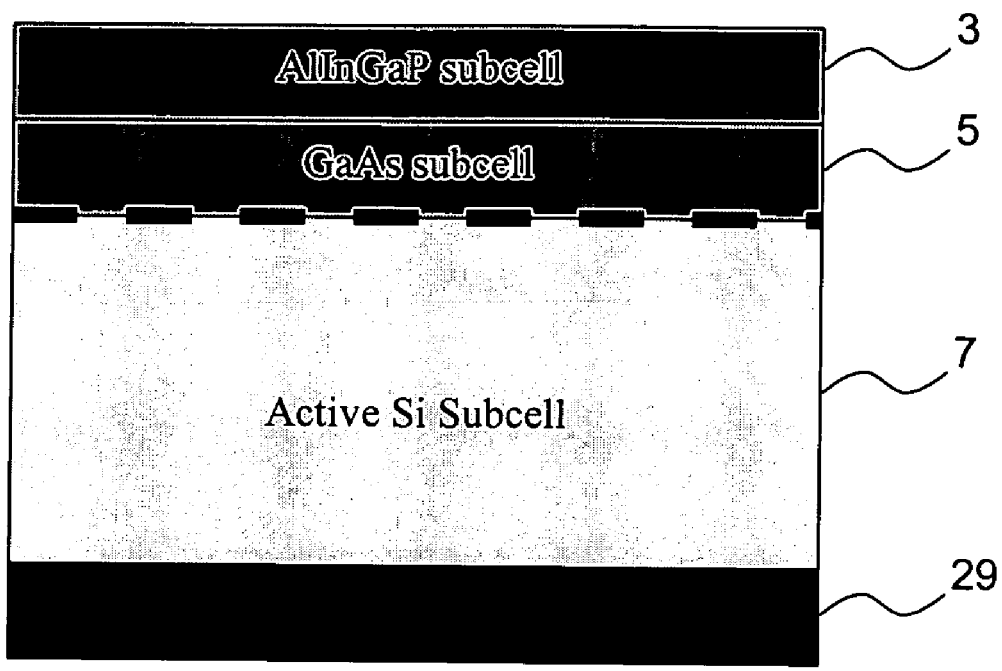

FIG. 4 illustrates a fourth example of a four junction cell 31. The cell 31 structure shown in FIG. 4 is similar to that of cell 31 shown in FIG. 3. However, in this case, the Ge p-n junction subcell 29 is created on an intermediate handle substrate and then transferred to the back of the silicon substrate using wafer bonding. Thus, the Ge template layer 28 is omitted. As with the previous cell fabrication methods, the bonding of the Ge subcell 29 can be performed either prior to or following the integration of the AlInGaP 3 and GaAs 5 subcells with the Si subcell 7.

Thus, four examples of four junction solar cells 1, 11, 21, and 31 have been illustrated. The band gaps of each subcell are stacked from the narrowest to the widest (with the cover glass being formed above the widest gap cell). In the examples above, InGaAs or Ge subcell 9, 29 comprises the narrowest band gap subcell, silicon subcell 7 has a wider band gap, the GaAs subcell 5 has an even wider band gap and the AlInGaP subcell 3 has the widest band gap.

Furthermore, in the examples above, a non-silicon single crystal layer, such as a template layer 8, or an active layer of a non-silicon subcell, such as an active layer of subcell 5 and/or 9, is bonded to a single crystal silicon substrate which is part of the silicon subcell 7. This non-silicon single crystal layer is not lattice matched to the silicon substrate. In other words, the non-silicon single crystal layer has a significantly different lattice spacing than the single crystal silicon substrate.

The non-silicon single crystal layer is transferred from a single crystal bulk non-silicon substrate. This layer has a single crystal structure quality which is within an order of magnitude from that of the single crystal bulk non-silicon substrate. As shown in FIGS. 1-4, an abrupt bonded interface is present between the non-silicon layer and the silicon substrate such that a metamorphic layer is not located between the first layer and the silicon substrate. Thus, an abrupt change in materials is present at the bonded interface, which occurs over a distance smaller than could be accomplished with a metamorphic process.

In general, a conductive bond is present between the non-silicon layer and the silicon substrate. For example, a first highly doped tunnel junction is located between the first non-silicon subcell 5 and the active silicon subcell 7 and a second highly doped tunnel junction is located between the second non-silicon subcell 9 and the active silicon subcell 7. Alternatively, an interface between the silicon subcell 7 and one or both non-silicon subcells 5 and 9 may be made electrically insulating. In this case, the silicon subcell 7 may be connected in parallel to one of both of subcells 5 and 9 by forming separate electrode contacts to these subcells.

In other embodiments described below, wafer bonding enables the formation of multi-junction, such as four-junction, solar cells that contain non-lattice-matched III-V compound semiconductors integrated with a mechanical substrate used to fabricate the solar cells. Thus, in these embodiments described below, rather than using the active silicon subcell as the supporting substrate during manufacturing, one or more mechanical substrates are used.

Second Embodiment: Flexible Substrate

Figure 5:
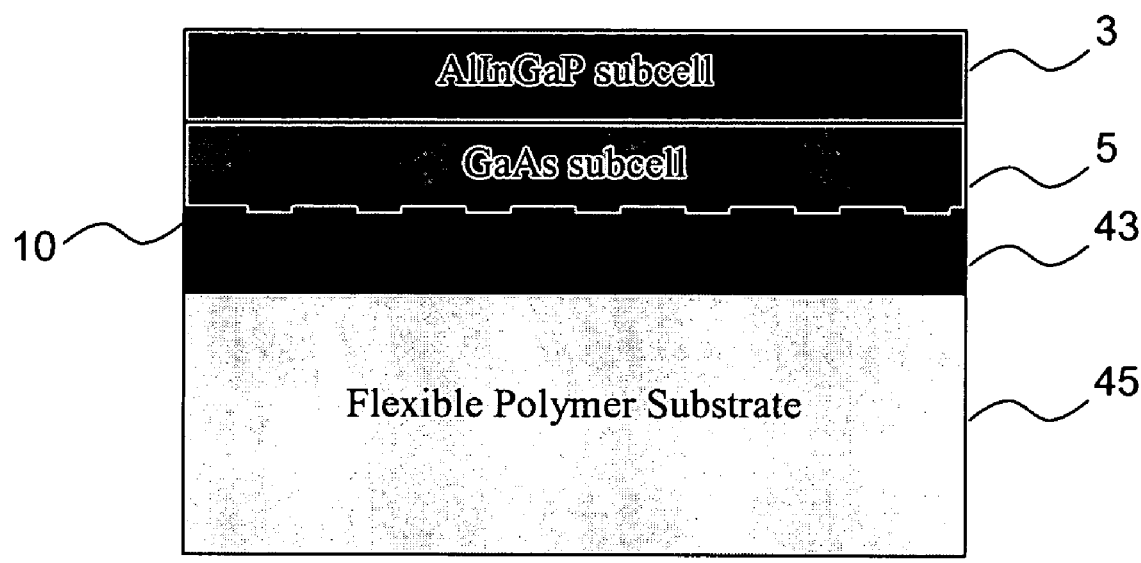
Figure 6:
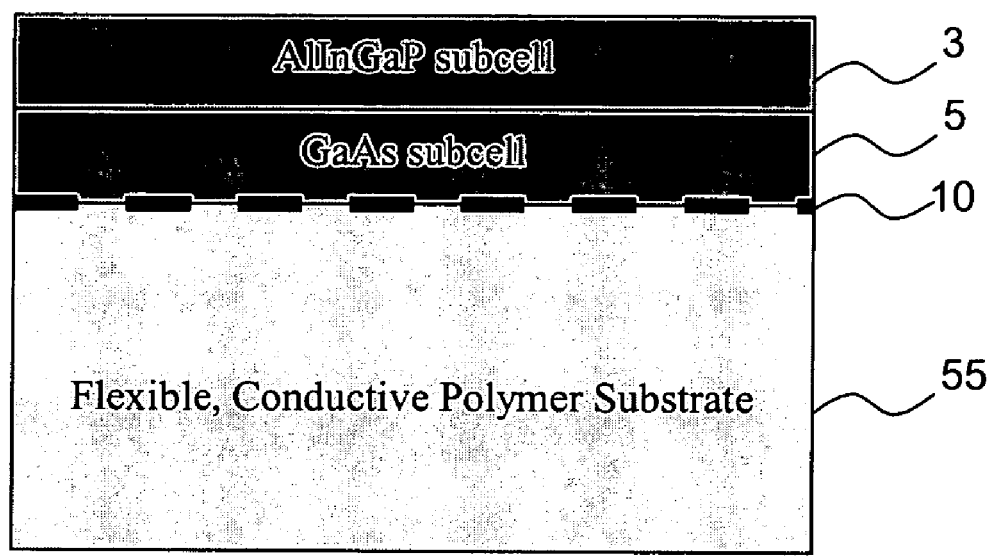

In a second embodiment of the invention, wafer bonding enables high-performance III-V and group IV solar cells to be bonded to flexible substrates. FIGS. 5 and 6 show two exemplary configurations for such a cell on a flexible substrate. In FIG. 5, a solar cell 41 comprised of AlInGaP and GaAs p-n junction subcells 3, 5 is bonded to a metallic bonding layer 43 that also serves as a backside electrical contact for the solar cell 41. The metal bonding layer 43 is formed over a flexible substrate, such as a flexible polymer substrate 45. A bonded interface 10 is located between subcell 5 and the metal layer 43.

FIG. 6 shows another exemplary solar cell 51. In this case, the subcells 3, 5 are directly bonded to a flexible, electrically-conductive polymer substrate 55. In this case, the metal layer 43 may be omitted because the polymer substrate is conductive and acts as a backside electrical contact. If the conductive substrate 55 is optically transparent, then it can act as a front side contact. While a two junction solar cell is illustrated in FIGS. 5 and 6, three and four junction cells containing any suitable subcell combinations may be used instead.

Two junction cells 41, 51 may be made by growing the subcells 3, 5 upside-down on a GaAs template on an intermediate handle substrate and then transferring the subcells 3, 5 from the handle substrate to the metallized flexible polymer substrate 45 or to the conductive substrate 55. In this case, the method of forming a multi-junction solar cell comprises epitaxially forming at least two subcells on a semiconductor template, such as the GaAs template, with a widest band gap subcell 3 being formed closest to the template, and bonding a flexible substrate 45, 55 to a narrowest band gap subcell 5. Alternatively, the narrower band gap subcell 5 may be grown on a GaAs substrate, then a wider band gap subcell 3 may be grown on subcell 5, then subcell 3 may be bonded to a handle substrate, then subcells are exfoliated from the GaAs substrate, then the flexible substrate 45, 55 may be bonded to the subcell 5 followed by removal of the handle substrate. The use of a handle substrate is described in more detail in the third embodiment below.

Third Embodiment: Temporary Handle Structure

The solar cells described herein may be made using an intermediate or temporary handle structure during fabrication. For example, one handle structure comprises a thin semiconductor film or layer that acts as an epitaxial template that has been bonded to an inexpensive handle substrate.

An intermediate handle structure is generally used herein to refer to a low-cost mechanical handle substrate that supports a thin transferred layer of semiconductor material. That semiconductor material then serves as an epitaxial template for the growth of a solar cell device structure. The design of the handle structure is such that following the fabrication of a solar cell device on the handle structure, the solar cell can be bonded to a secondary substrate or support, such as a Si substrate or a flexible film, as described in the first two embodiments. The handle substrate may comprise a semiconductor substrate or wafer, or a glass, plastic, metal or ceramic substrate. Upon bonding, the handle structure features some component that facilitates the release of the solar cell device from the handle substrate and the permanent integration of the solar cell device structure with its final device substrate.

Figure 7:
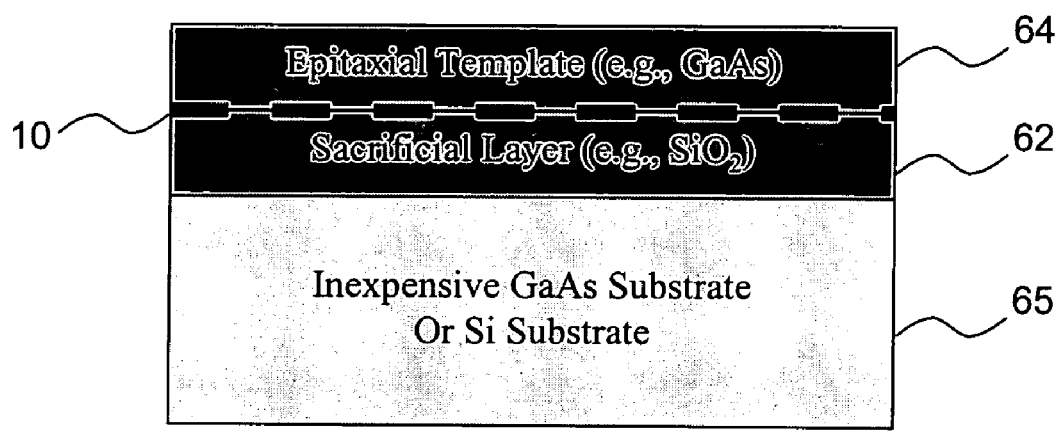

FIG. 7 shows an example of an intermediate handle structure for GaAs and growth of GaAs-lattice-matched materials comprising AlInGaP and GaAs. Specifically, FIG. 7 shows a handle structure 61 comprising a GaAs engineered epitaxial template layer 64 for AlInGaP/GaAs subcell 3, 5 growth bonded to $SiO_2$ sacrificial release layer 62. The release layer is formed on a low cost mechanical handle substrate 65, such as a Si or GaAs wafer 65. Layer 62 may be formed on the substrate 65 by CVD or other methods.

Figure 8:
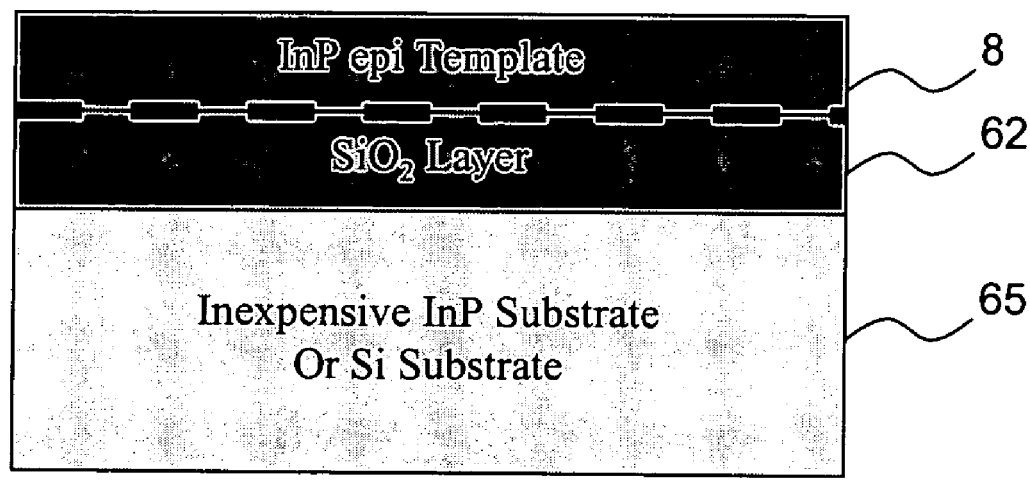

Alternative intermediate handle structures could include a number of materials including, but not limited to, InP, Ge, and GaAs. A handle structure 71 for InP is shown in FIG. 8. Specifically, FIG. 8 shows the InP epitaxial template layer 8 for InGaAs subcell 9 growth bonded to the $SiO_2$ sacrificial layer 62 on substrate 65.

In general, in the intermediate handle structures, the thin semiconductor film or layer 8, 64 that will act as a template for the growth of the epitaxial layers is bonded to a sacrificial layer 62 that is disposed onto an inexpensive handle substrate 65. The thin semiconductor layer 8, 64 may be formed on the sacrificial layer 62 through any of a number of bonding processes, in which a thin film on a bulk donor substrate or the bulk donor substrate itself is bonded to the sacrificial layer 62 followed by separation of the thin film or a thin film portion of the bulk substrate from the rest of the donor substrate. The separation methods include but are not limited to ion implantation-induced exfoliation of a thin film portion of a bulk donor substrate, ion implantation through a thin film grown on top of a donor bulk substrate followed by exfoliation of the thin film and a thin portion of the bulk donor substrate, and/or by a back side etching or polishing process to remove the remnants of the bulk donor substrate to leave a thin film bonded to the sacrificial layer.

The purpose of the sacrificial layer 62 is to enable the easy separation of the epitaxial template layer 8, 64 and the device grown on it from the handle substrate 65 via a lateral etch or other process. In the case of the structures shown in FIGS. 7 and 8, silicon dioxide is used as it is highly susceptible to a variety of material specific etches. However, any other suitable materials could be used for the sacrificial layers which are selectively etched compared to the semiconductor template material, the sacrificial materials including but not limited to silicon nitride, porous silicon, amorphous silicon or silicon-germanium alloys.

Thus, a method of making a multi-junction solar cell comprises performing an ion implantation, such as hydrogen and/or helium ion implantation, into a semiconductor donor substrate (i.e., a semiconductor wafer or a wafer covered with an epitaxial semiconductor layer), bonding the implanted side of the semiconductor donor substrate to a release layer located on a handle substrate, annealing the semiconductor substrate to separate a semiconductor thin film (i.e., the template layer) from the semiconductor substrate, such that a semiconductor thin film remains attached to the release layer, forming at least one subcell of the multi-junction solar cell on the semiconductor thin film by epitaxial growth or other methods, attaching a solar cell support or substrate to at least one subcell of the solar cell, and selectively etching the release layer to separate the solar cell attached to the subcell(s) support or substrate from the handle substrate.

Figure 9:
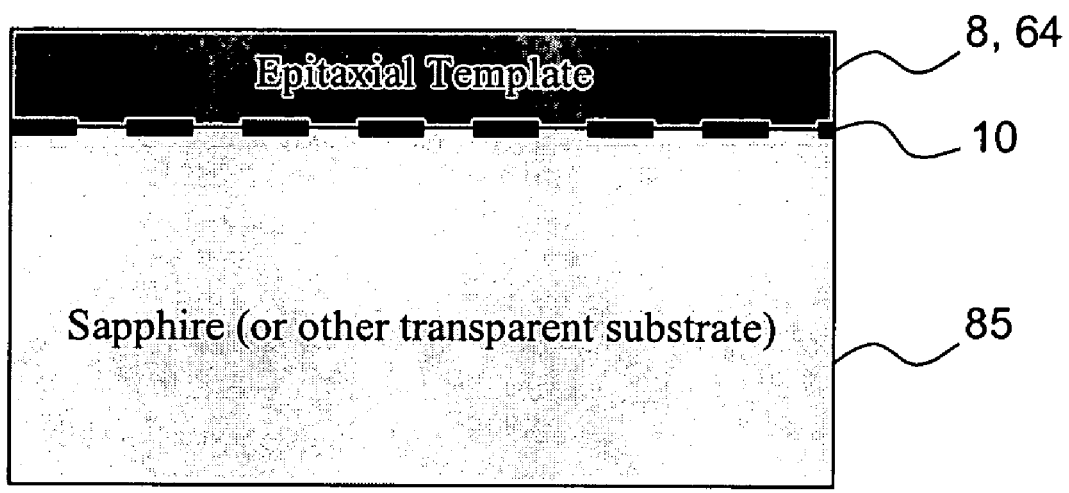

In cases where a lateral etch is undesirable, selective heating and decomposition of the bonded interface 10 between the semiconductor template layer 8, 64 and the handle structure may be used to release the template layer from the handle structure after formation of the solar cell. For example, in one aspect of the third embodiment, a handle structure 81 shown in FIG. 9 includes a transparent handle substrate 85, such as a sapphire substrate, for example. Other transparent materials may also be used. To release the epitaxial template layer 8, 64 and the solar cell subcell(s) which are epitaxially grown on the template layer from the handle substrate 85, the bonded interface 10 between the substrate 85 and the epitaxial template layer 8, 64 is irradiated with a high-power laser or flash lamp through the substrate 85. If the photon energy of the laser or lamp is above the bandgap of the bonded epitaxial template layer, then photon absorption will lead to extreme heating at the bonded interface 10 and should lead to a weakening or decomposition of the epitaxial template layer 8, 64 at the interface 10, and consequently, release of the layer 8, 64 from the handle substrate 85. If a low temperature substrate 85 material, such as glass or polymer, is used, then the irradiation may weaken or decompose the substrate 85 rather than the portion of the template layer 8, 64. If desired, a sacrificial layer 62 may be formed between the epitaxial template layer 8, 64 and the substrate 85. In this case, the irradiation would weaken or decompose the sacrificial layer 62 rather than the template layer 8, 64.

Thus, a method of making a semiconductor device comprises providing a semiconductor layer on a radiation transparent substrate and irradiating an interface between the layer and the substrate with radiation through the substrate to separate the layer from the substrate. Preferably, a semiconductor device, such as a multi-junction solar cell, is formed on the semiconductor layer prior to the step of irradiating. Preferably, a second substrate (i.e., a device substrate) is bonded or attached to the semiconductor device, such as the solar cell, prior to the step of irradiating.

Once the subcells 3, 5 or 9 are grown on the epitaxial template layer 64 or 8, respectively, there are two options for bonding the devices to the final device structure, substrate or support (i.e., to the solar cell substrate or support, which includes bonding the devices to other subcells already attached to the permanent solar cell substrate).

The first method of fabrication is to bond and transfer the epitaxial template and device structure directly to the final solar cell structure. The second method of fabrication is to bond the subcell and epitaxial template to an intermediate structure and then, in a second step, bond and transfer the subcell and epitaxial template to the final solar cell structure. This intermediate bonding step enables the subcell structure and epitaxial template to be inverted in the final structure which may be preferable in certain cases. Alternatively, the device structure can be grown in an inverted orientation on an intermediate handle structure. Thus, when bonding the device structure to its final handle substrate or material, the order of the layers in the cell is naturally inverted.

Figure 10:
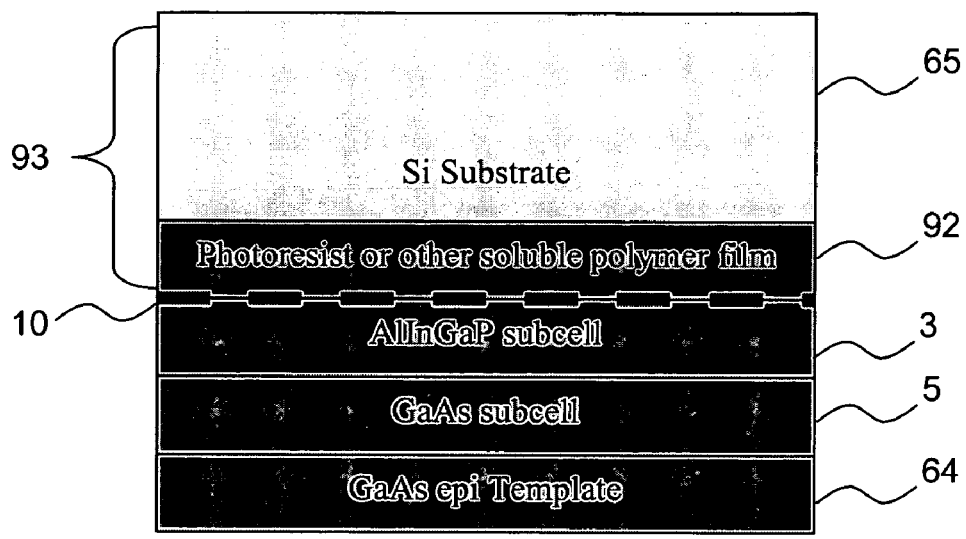

FIG. 10 shows an in-process solar cell 91 including an intermediate handle structure 93 that has a GaAs epitaxial template 64 and GaAs 5 and AlInGaP 3 subcells bonded to it. The intermediate handle structure 93 is comprised of an inexpensive handle substrate (in this case, a silicon wafer) 65 and a polymer bonding layer 92. The purpose of the polymer layer 92 is to act as a release layer to simplify the transfer of the epitaxial template and sub-cells 3, 5 to a final device substrate in a later process step. This intermediate structure 91 is used to 'flip' the orientation of the sub-cells 3, 5 prior to bonding to the final device substrate (i.e., the template layer 64 is bonded to the device substrate, as shown in FIG. 1 for example.).

Figure 11:
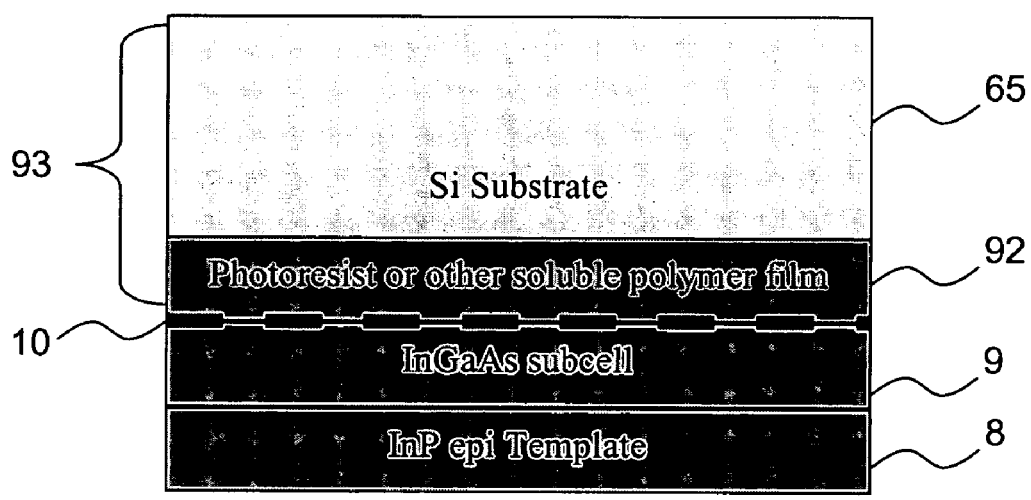

A similar intermediate structure for the transfer of InP epitaxial template layer 8 and InGaAs sub-cell 9 is shown in FIG. 11. This intermediate structure is used to 'flip' the orientation of the sub-cell 9 prior to bonding to the final device substrate (i.e., the template layer 8 is bonded to the final device substrate, as shown in FIG. 2, for example). The handle structure 93 is removed after the subcell(s) are bonded to the device substrate.

Thus, a method of making a multi-junction solar cell comprises forming one or more subcells on a semiconductor template layer located on a donor substrate, attaching a handle structure to a side of the one or more subcells which is opposite from the donor substrate, removing the donor substrate from the one or more subcells, attaching a permanent solar cell substrate or support to a side of the one or more subcells where the donor substrate was located, and separating the handle structure from the one or more subcells.

Fourth Embodiment: Multi-Junction Cells Directly Bonded To Cover Glass

Figure 12:
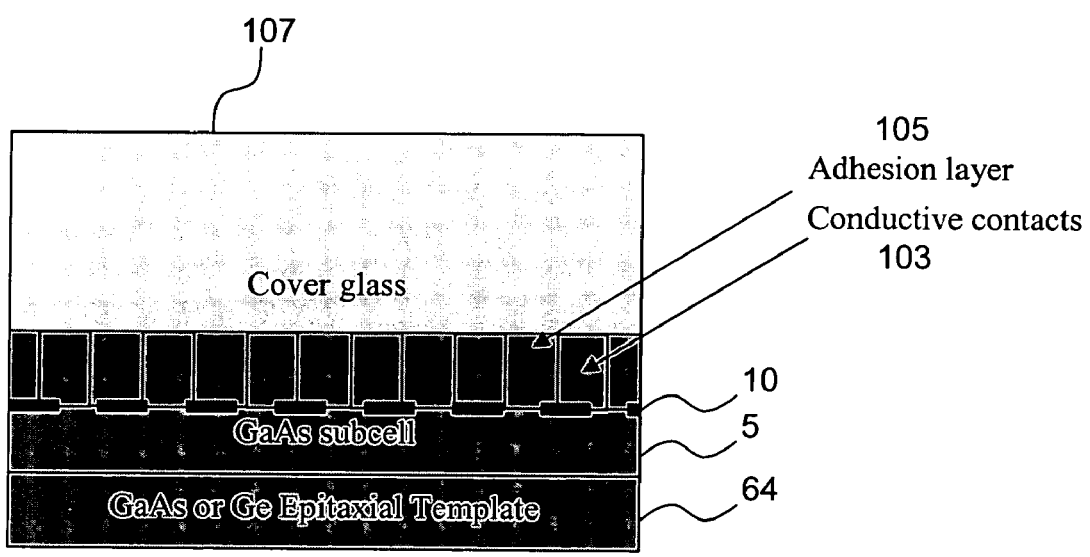
Figure 13:
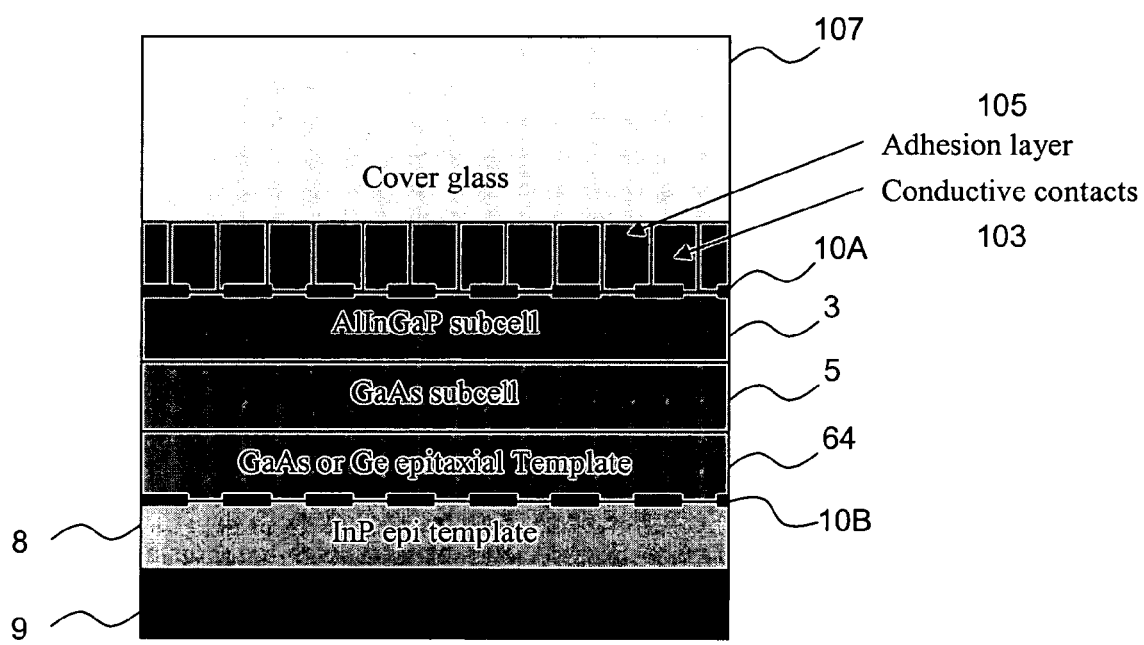

In the assembly of solar cell modules, the cell is generally encapsulated in a cover glass or other protective material which is transparent to solar radiation (such as a polymer or ceramic material) to protect the solar module from its surrounding environment, such as either a terrestrial or a space ambient. Preferably, the protective structure comprises a solar radiation transparent plate. Wafer bonding enables multi-junction cells to be directly bonded to the cover glass of the solar cell in order to reduce cell mass and cost. In such a cell design, one or more intermediate handle structures of the third embodiment are used to fabricate the solar cell device structure. From the handle structures, the device can be bonded and transferred onto the cover glass interconnect structure. Thus, the cover glass serves as a mechanical support structure and as the final device substrate. FIGS. 12 and 13 depict cover glass bonded structures for a variety of multi-junction cells. In all cases, the actual cell is bonded to a layer that is comprised of the metal contact leads and a bonding material which can be any of a number materials including, but not limited to, spin-on glasses or transparent polymers, which promote bonding and prevents the trapping of gas bubbles between the cover glass and solar cell.

FIG. 12 illustrates a solar cell 101 comprising a GaAs 5 subcell bonded to conductive contacts 103 and an adhesion layer 105 deposited on a cover glass plate 107. The resulting cell uses the cover glass as the support structure, thereby reducing overall mass and cost. The dashed line 10 indicates a bonded layer or interface. If desired, the AlInGaP subcell 3 may be formed on the GaAs subcell 5 before bonding to the glass plate 107. In this case, subcell 3 is bonded to the contacts 103 and adhesion layer.

FIG. 13 illustrates a solar cell 111 which includes AlInGaP 3, GaAs 5, and InGaAs 9 subcells bonded to conductive contacts 103 and an adhesion layer 105 deposited on the cover glass plate 107. Thus, the multi-junction solar cell 111 comprises a GaAs or Ge template layer 64, a GaAs subcell 5 epitaxially grown on a first side of the GaAs or Ge template layer 64, an AlInGaP subcell 3 formed on the GaAs subcell, an InP template layer 8 having a first side bonded to a second side of the GaAs or Ge template layer 64, and an InGaAs subcell 9 epitaxially grown on a second side of the InP template layer 8. Preferably, the AlInGaP subcell is bonded to a solar radiation transparent protective structure, such as a cover glass 107. If desired, the solar cell 111 may also include the active silicon subcell 7 of the first embodiment shown in FIGS. 1-4. In some implementations, either or both of the epitaxial templates 8, 64 may be omitted, as shown in FIGS. 2 and 4.

Thus, a multi-junction solar cell module 101, 111 of the fourth embodiment comprises a solar radiation transparent protective structure, such as a cover glass 107, and a multi-junction solar cell, wherein a subcell 3 of the solar cell with a widest bandgap of all subcells of the solar cell is bonded to the protective structure 107. A method of making a multi-junction solar cell module of the third and fourth embodiments includes forming at least one subcell 3, 5 and/or 9 of a multi-junction solar cell on a handle structure 93, bonding the at least one subcell to a solar radiation transparent protective structure 107, and removing the handle structure 93 to leave at least one subcell bonded to the protective structure.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents. All patent applications mentioned herein are incorporated by reference in their entirety. Specifically, the following U.S. application Ser. Nos. 10/233,125, 10/761,918 and 10/784,586, filed on Apr. 17, 2002, Jan. 20, 2004 and Feb. 23, 2004, respectively, and U.S. Provisional Applications Ser. Nos. 60/564,251 and 60/526,332 filed Apr. 21, 2004 and Dec. 2, 2003, respectively, are all incorporated herein by reference in their entirety. are incorporated herein by reference in their entirety.

What is claimed is:

1. A method of making a multi-junction solar cell, comprising:

providing an active silicon subcell;

bonding a first non-silicon subcell to a first side of the active silicon subcell; and bonding a second non-silicon subcell to a second side of the active silicon subcell:

wherein:

the step of bonding the first non-silicon subcell to the first side of the active silicon subcell comprises epitaxially growing at least one first non-silicon layer of the first non-silicon subcell on a first template layer located on a first handle substrate, bonding the first non-silicon subcell to the first side of the active silicon subcell, and removing the first handle substrate; and the step of bonding the second non-silicon subcell to the second side of the active silicon subcell comprises epitaxially growing at least One second non-silicon layer of the second non-silicon subcell on a second template layer located on a second handle substrate, bonding the second non-silicon subcell to the second side of the active silicon subcell, and removing the second handle substrate; and further comprising:

implanting ions into a first donor substrate, bonding the first donor substrate to the first handle substrate, and annealing the first donor substrate after the step of bonding the first donor substrate to exfoliate the first template layer from the first donor substrate; and implanting ions into a second donor substrate, bonding the second donor substrate to the second handle substrate, and annealing the second donor substrate after the step of bonding the second donor substrate to exfoliate the second template layer from the second donor substrate.

2. A method of making a multi-junction solar cell, comprising:

providing an active silicon subcell;

bonding a first non-silicon subcell to a first side of the active silicon subcell; and bonding a second non-silicon subcell to a second side of the active silicon subcell;

wherein:

the step of bonding the first non-silicon subcell to the first side of the active silicon subcell comprises epitaxially growing at least one first non-silicon layer of the first non-silicon subcell on a first template layer located on a first handle substrate, bonding the first non-silicon subcell to the first side of the active silicon subcell, and removing the first handle substrate; and the step of bonding the second non-silicon subcell to the second side of the active silicon subcell comprises epitaxially growing at least one second non-silicon layer of the second non-silicon subcell on a second template layer located on a second handle substrate, bonding the second non-silicon subcell to the second side of the active silicon subcell, and removing the second handle substrate;

the step of removing the first handle substrate comprises selectively etching a first release layer located between the first handle substrate and first template layer; and the step of removing the second handle substrate comprises selectively etching a second release layer located between the second handle substrate and second template layer.

3. A method of making a multi-junction solar cell module, comprising:

forming at least one subcell of a multi-junction solar cell on a handle structure;

bonding the at least one subcell to a solar radiation transparent protective structure;

removing the handle structure to leave at least one subcell bonded to the protective structure;

implanting ions into a semiconductor donor substrate;

bonding the implanted side of the semiconductor donor substrate to the handle structure comprising a release layer located on a handle substrate;

annealing the semiconductor donor substrate to separate a semiconductor template layer from the semiconductor donor substrate, such that the template layer remains attached to the release layer;

forming the at least one subcell of the multi junction solar cell on the template layer;

attaching the solar radiation transparent protective structure to the at least one subcell using an adhesion layer containing conductive contacts; and selectively etching the release layer to separate the at least one subcell from the handle substrate.

4. The method of claim 3, wherein:

the solar radiation transparent protective structure comprises a cover glass; and the step of forming the at least one subcell comprises epitaxially growing at least two subcells of the solar cell on the template layer.

5. The method of claim 4, wherein the multi-junction solar cell comprises:

a GaAs or Ge template layer;

a GaAs subcell epitaxially grown on a first side of the GaAs or Ge template layer;

an AlInGaP subcell formed on the GaAs subcell and bonded to the cover glass;

an InP template layer having a first side bonded to a second side of the GaAs or Ge template layer; and an InGaAs subcell epitaxially grown on a second side of the InP template layer.

\* \* \* \* \*